United States Patent
Zhang et al.

(10) Patent No.: US 9,076,699 B2
(45) Date of Patent: Jul. 7, 2015

(54) TSV BACKSIDE REVEAL STRUCTURE AND EXPOSING PROCESS

(71) Applicant: National Center for Advanced Packaging Co., Ltd., Wuxi, Jiangsu Province (CN)

(72) Inventors: Wenqi Zhang, Wuxi (CN); Haiyang Gu, Wuxi (CN); Chongshen Song, Wuxi (CN)

(73) Assignee: National Center for Advanced Packaging Co., Ltd., Wuxi (CN)

( * ) Notice: Subject to any disclaimer, the term of this patent is extended or adjusted under 35 U.S.C. 154(b) by 8 days.

(21) Appl. No.: 14/071,459

(22) Filed: Nov. 4, 2013

(65) Prior Publication Data
US 2014/0329381 A1 Nov. 6, 2014

(30) Foreign Application Priority Data

May 3, 2013 (CN) .......................... 2013 1 0163509
May 3, 2013 (CN) .......................... 2013 1 0163510

(51) Int. Cl.
*H01L 21/768* (2006.01)
*H01L 23/00* (2006.01)
*H01L 21/321* (2006.01)
*H01L 21/306* (2006.01)

(52) U.S. Cl.
CPC ............ *H01L 24/13* (2013.01); *H01L 21/3212* (2013.01); *H01L 21/30625* (2013.01); *H01L 21/76898* (2013.01); *H01L 24/11* (2013.01)

(58) Field of Classification Search
CPC ..................... H01L 21/768898; H01L 23/481; H01L 21/30625; H01L 21/3212; H01L 21/76898
USPC .......................... 438/666, 667, 690, 691, 692; 257/E21.597
See application file for complete search history.

(56) References Cited

U.S. PATENT DOCUMENTS

2010/0081279 A1* 4/2010 Palmer et al. ................ 438/667

* cited by examiner

*Primary Examiner* — Thanhha Pham

(57) ABSTRACT

A TSV exposing process is provided, including: performing a mechanical grinding process on the substrate back surface of a substrate with a TSV conductive column, a liner between the substrate and the TSV conductive column; performing a first and a second chemical mechanical polishing process on the grinded substrate back surface; then performing an etching on the substrate back surface, and making the TSV backside reveal more than 10 μm.

13 Claims, 4 Drawing Sheets

TSV BACKSIDE REVEAL STRUCTURE AND EXPOSING PROCESS

CROSS-REFERENCE TO RELATED APPLICATION

This application claims priority from CN Patent Application Serial No. 201310163510.6, filed on May 3, 2013, and also claims priority from CN Patent Application Serial No. 201310163509.3, filed on May 3, 2013, the entire contents of which are incorporated herein by reference for all purposes.

FIELD OF THE INVENTION

The present invention is related to microelectronics technology, especially related to a through-silicon-via backside reveal structure and its production process.

BACKGROUND OF THE INVENTION

With the rapid development of the microelectronics technology, the feature size of the integrated circuit keeps scaling down, and the interconnection density increases. At the same time, the user has an increasing demand for high performance and low power consumption. In this case, the way of further reducing the line width of interconnection line to improve, the performance is limited by the physical properties of the material and the equipment craft. Hence, the resistance and capacitance (RC) delay of the 2D interconnection line gradually becomes the bottleneck of the performance improvement of semiconductor chip. Through silicon via (TSV) process can realize, the 3D interconnection, between wafers (chips) or between a chip and a substrate by producing metal columns in wafers with metal bumps, which can make up for the limitations of traditional 2D wiring of semiconductor chips. Compared with the traditional stacking techniques including the bonding technique, this interconnection method has increased, the 3D stacking density and reduced packaging dimension, thus it can greatly improve the speed of the chip and reduce the power consumption. Therefore, TSV technique is becoming one of the key techniques for the high density packaging.

TSV is a technique that produces vertical via holes between chips or between wafers, and deposits the conductive material in vertical via holes by using the methods including electroplating to realize the interconnection. Specifically, TSV is exposed from the substrate by thinning the back surface of the wafer, and then bumps are formed on the exposed TSV. These bumps are both electrically and mechanically connected with the corresponding bumps (i.e., solder bumps) on prefabricated adjacent substrates or chips. Due to the inevitable non-uniformity problem of the current Si processing techniques, when performing 3D/2.5D integration process on the chip or wafer including fine-pitch bumps (less than 40 μm), there exists a height difference among the exposed TSVs, which is called total thickness variation (TTV) and is usually larger than 2 μm. Hence, to ensure that all the TSVs expose out of the back surface of the wafer and guarantee the effective interconnection between the hump and the TSV metal, the maximum height of the exposed TSV on the wafers should be larger than 2 μm. However, such a height difference is a challenge for the physical vapor deposition (PVD) technique that deposits the 2D electroplating seed layer in the general bump production process. The existing equipment and technology can hardly guarantee the continuity of the seed layer close to the lateral wall of TSV when the TSV backside reveal is perpendicular to the silicon substrate. Especially, since the size of the micro bump is usually slightly larger than that of the TSV, when the micro bumps directly form on the TSV, voids usually form on the lateral wall of the TSV and the junction of the silicon substrate and TSV, which affects the reliability of the interconnection.

The technical scheme for solving the aforementioned problem has not been found in prior art.

SUMMARY OF THE INVENTION

Embodiments of the present invention provide a TSV backside reveal structure, which can overcome the potential faulting problem of a seed layer when a conventional PVD technique is used to produce the seed layer, and improve the reliability of the connection between a micro bump and the back tip of the corresponding TSV.

Another embodiment of the present invention also provides a TSV exposing process. This process can produce the required backside reveal structure and avoid the TTV on the exposed TSV, ensure that all the exposed TSVs meet the height requirement, and reduce the damage to the back tip of the TSV during the TSV exposing process.

BRIEF DESCRIPTION OF THE DRAWINGS

To give a further description of the embodiments in the present invention or the prior art the appended drawings used to describe the embodiments and the prior art will be introduced as follows. Obviously, the appended drawings described here are only used to explain some embodiments of the present invention. Those skilled in the art can understand that other appended drawings may be obtained according to these appended drawings without creative work.

DETAILED DESCRIPTION OF THE INVENTION

Figure 1:
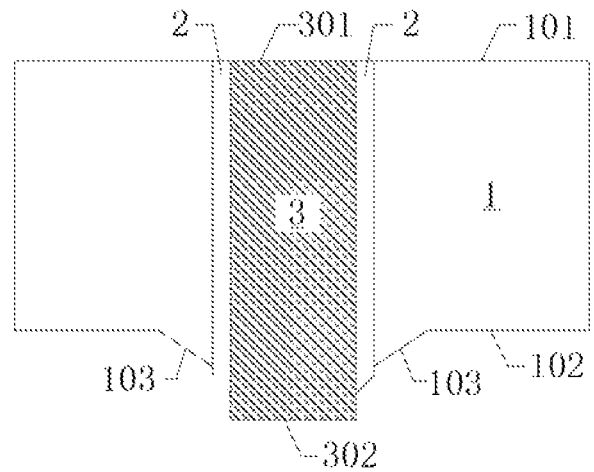
FIG. 1 illustrates the schematic diagram TSV backside reveal in an embodiment of the present invention.

The embodiments of the present invention are described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. Among other things, the present invention may be embodied as systems, methods or devices. The following detailed description should not to be taken in a limiting sense.

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments of the invention may be readily combined, without departing from the scope or spirit of the invention.

In addition, as used herein, the term "or" is an inclusive "or" operator and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on". The term "coupled" implies that the elements may be directly connected together or may be coupled through one or more intervening elements. Further reference may be made to an embodiment where a component is implemented and multiple like or identical components are implemented.

While the embodiments make reference to certain events this is not intended to be a limitation of the embodiments of the present invention and such is equally applicable to any event where goods or services are offered to a consumer.

Further, the order of the steps in the present embodiment is exemplary and is not intended to be a limitation on the embodiments of the present invention. It is contemplated that the present invention includes the process being practiced in other orders and/or with intermediary steps and/or processes.

Embodiments of the present invention provide a TSV backside reveal structure. This TSV backside reveal structure exhibits a continuous height variation between the exposed TSV and a substrate surface, which changes the original perpendicular relationship between the exposed TSV and the substrate surface, and overcomes the potential faulting problem of seed layer in PVD process, and provides the reliability of the connection between the bump and the exposed TSV.

Specifically, the TSV backside reveal structure sets a buffer structure between the exposed TSV and the substrate surface. For example, the buffer structure may be a slope with its height gradually decreases from the exposed TSV to the substrate surface. By setting the slope, a transition region forms between the exposed TSV and the substrate surface, which realize the aforementioned function and achieves the technical effect of the present invention.

In the following content, a further description of the technical scheme proposed in the present invention will be given with embodiments.

FIG. 1 illustrates the schematic structure of the TSV backside reveal in an embodiment of the present invention. As shown in FIG. 1, there is TSV conductive column 3 on a semiconductor substrate 1, where TSV conductive column 3 runs throughout the substrate front surface 101 and substrate hack surface 102, and stretches out of the substrate back surface 102 to form the backside reveal.

The semiconductor substrate 1 is preferred to be a semiconductor chip, whose material may be semiconductor materials including silicon, germanium, gallium nitride, and gallium arsenide. The chip includes some electronic components on the substrate front surface 101 or inside the substrate. It is preferred but not required that the chip includes a semiconductor interlayer structure, for example, a liner, conductive layer, conductive pattern region, and other connection and wiring structures designed for combining the above electronic components into a complete circuit. In one implementation method, the semiconductor chip may include multiple interaction layers composed by the above liner and the conductive layer. Typically, the number of the interaction layers may be set as three to twelve. In one embodiment, the number of the interaction layers may be set as two.

The electronic component on the semiconductor chip may include an active component, a passive component, or the combination of the active and passive components made via the semiconductor technology. The electronic component on the semiconductor chip may include a single transistor, a single semiconductor die, or the combination of the transistor and the semiconductor die connected to the semiconductor chip via the welding, wire bonding or flip-chip technology.

The TSV conductive column 3 forms on the semiconductor substrate 1 produced in above ways. The number and distribution of the TSV conductive column 3 depend on the connection requirement of the semiconductor chip. For example, multiple TSV conductive columns may be uniformly distributed in the device region of the semiconductor chip, or a certain number (e.g., 2, 4) of the TSV conductive columns may be distributed in the marginal area of the semiconductor chip, or the TSV conductive columns may be non-uniformly distributed in the wiring region.

In the production of the TSV conductive column 3, the first step is to recess the device at certain locations. The recessing may be realized by the semiconductor etching process or other feasible techniques including mechanical drilling and laser drilling. Secondly, a liner 2 is produced on the wall of the hole. The liner 2 may be made by oxide, nitride, or other insulating materials. Taking the semiconductor substrate as silicon as example, the liner 2 may be made by silicon oxide, silicon nitride, silicon oxynitride, etc. The liner 2 may be made via directly performing oxidation or nitridation on the substrate, or via the coating techniques including chemical vapor deposition (CVD), plasma enhanced chemical vapor deposition (PECVD), and low pressure chemical vapor deposition (LPCVD). The liner 2 is set between the TSV conductive column 3 and the semiconductor substrate 1 to serve as the insulation, which prevents the conductive material in TSV from affecting the carrier change in the semiconductor.

After achieving the TSV hole with the said liner 2, the TSV conductive column 3 is produced inside the hole by metal deposition. The TSV conductive column 3 is preferred to be made by metal material, such as Tungsten, copper, silver, nickel, etc. Other conductive materials, such as doped polycrystalline silicon and their combination, also may be used in the TSV conductive column 3. The front surface 301 of the TSV conductive column 3 is preferred to be connected with electronic components, the conductive layer, or the conductive pattern region on the substrate front surface 101. The back surface 302 of the TSV conductive column 3 stretches out of the substrate back surface 102, to connect the electronic components on the substrate front surface 101 with the substrate back surface 102. Finally, the substrate back surface 102 is thinned to expose the back surface 302 of the TSV conductive column 3 and produce the TSV backside reveal.

Figure 2:
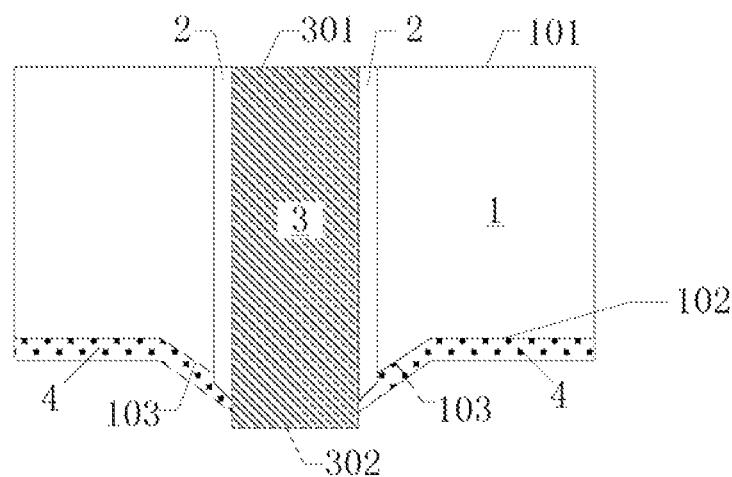
FIG. 2 illustrates the schematic diagram of a TSV backside reveal in another embodiment of the present invention.

In the specific application, if the conductive column 3 is made by copper, a barrier (it is not shown in the FIG. 1, however, it is shown in FIG. 5) may be set between the liner 2 and the TSV conductive column 3. If the conductive column 3 is made by tungsten, the harrier is not necessary, as shown in FIG. 2. The barrier can prevent the conductive material from running through the liner 2, penetrating into the semiconductor substrate, and hence damaging the semiconductor substrate and electronic components on the semiconductor substrate when TSV conductive column is produced.

In the present invention, the thinning process depends on the location, i.e., removing less substrate materials in the region around the TSV and removing more substrate in other regions. Furthermore, the preferential etching is performed on the substrate of the region around the TSV. The principle of the preferential etching includes the etch rate gradually increases as the distance to the TSV increases. That is, the etch rate of the substrate region close to the TSV is relatively low, and that of the substrate region far away from the TSV is relatively fast, so that a sloping buffer 103 is formed. The height of the sloping buffer 103 changes continuously, where the region close to the TSV has the highest height and the height of the buffer gradually decreases to that of the substrate back surface 102. It is better that the highest height of the sloping buffer 103 is slightly lower than that of the TSV conductive column 3, which makes the backside reveal of TSV conductive column 3 effectively expose from the semiconductor substrate to ensure the subsequent electrical connection. As shown in the height of TSV conductive column 3, the height of the liner 2 on the outer edge of the TSV conductive column 3, and the height of the sloping buffer 103 decreases successively.

According to the embodiment shown in FIG. 1, the slope of buffer 103 is linear, and the shape of buffer 103 approximates a cone in 3D schematic. In other embodiment, the slope profile of buffer 103 may be a convex or concave curve, and the shape of buffer 103 approximates a hemisphere or a mountain cone in 3D schematic.

Due to the transition function of the sloping buffer 103, a continuous PVD seed layer may be deposited on the substrate back surface 102, the sloping buffer 103, and the back surface 302 of the TSV conductive column 3. So that the connection problems, such as the voids caused by the faulted seed layer between the TSV conductive column and the semiconductor substrate, can be avoided when the micro bumps are produced using the seed layer via, electroplating.

FIG. 2 illustrates the schematic diagram of the TSV backside reveal in the second embodiment of the present invention. As shown in FIG. 2, the second embodiment produces a dielectric layer 4 on the substrate back surface 102 of the semiconductor substrate 1 on the basis of the first embodiment. It is preferred the dielectric layer 4 includes silicon oxide, silicon nitride, epoxy resin, polyimide (PI), benzocyclobutene (BCB), or the combination of these materials. It is preferred to produce the dielectric layer 4 via a spin coating technique or deposition techniques including chemical vapor deposition (CVD), plasma enhanced chemical vapor deposition (PECVD), and low pressure chemical vapor deposition (LPCVD). The thickness of the dielectric layer 4 from the substrate back surface 102 is preferred to be set between 0.3 µm to 10 µm, or between 0.1 µm to 10 µm, according to the material of the dielectric layer 4. The dielectric layer 4 may be made by a single material, for example, the dielectric layer 4 may be PBO or PI with 4-8 µm thickness. The dielectric layer 4 also may be made by multilayer materials. In one embodiment, the dielectric, layer 4 may be made by silicon nitride and PBO, the silicon nitride is connected with the silicon substrate directly, and the PBO is deposited on top of the silicon nitride. The silicon nitride is adapted to preventing the spreading of Copper into the silicon substrate, however, due to the big stress, the thickness of the silicon nitride is limited; in one example, it is preferred to be 0.1 µm to 0.5 µm. The PBO is adapted to be the main insulating layer; in one example, it is preferred to be 4 µm to 8 µm. In one embodiment, the dielectric layer 4 may be made by 0.15 µm of the silicon nitride and 8 µm of the PBO.

In one embodiment, after the dielectric layer 4 is produced, the patterning operation process is performed to remove the dielectric layer 4 within the region of TSV conductive column 3 via development (when the dielectric layer is made by PBO) and etching (when the dielectric layer is made by silicon nitride) to expose the back surface 302 of the TSV conductive column 3. The dielectric layer 4 is adapted to prevent electrically short between the metal hump and the semiconductor substrate when producing the micro bumps.

Figure 3:
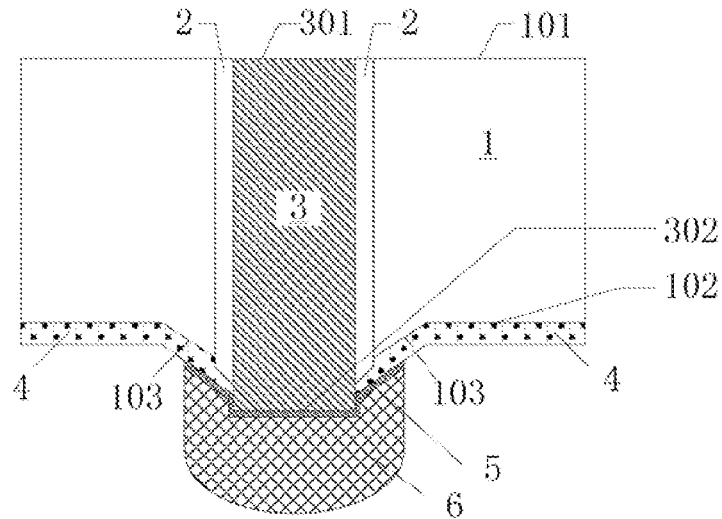
FIG. 3 illustrates the schematic diagram of a TSV backside reveal in another embodiment of the present invention.

FIG. 3 illustrates the schematic diagram of the TSV backside reveal in the third embodiment of the present invention. As shown in FIG. 3, in the embodiment, a metal seed layer 5 is produced on the back surface 302 of the TSV conductive column 3 on the basis of the second embodiment. The metal seed layer 5 is used to provide the current carrier for the electroplating process when the micro bump 6 is produced.

In an embodiment, the seed layer 5 may be made by multiple layers of metals, for example, made by chromium, chromium-copper alloy and copper, or other metal layers set over the layer of copper. Those skilled in the art can understand that other combinations may be achieved from the existing materials and layer arrangements, for example, the combinations may include titanium/copper, titanium tungsten/copper, titanium/copper/nickel, titanium/copper/nickel/gold. All the structures suitable for the seed layer should be included in the protection scope of the present invention.

The seed layer 5 may be deposited by different techniques according to the arrangement of the layers. It is preferred to produce the layers via sputtering technique, while other techniques including CVD and evaporation may be also used according to the requirement.

The micro bump 6 is produced on seed layer 5 after seed layer 5 is produced to form the complete TSV structure. Specifically, the process includes: covering the seed layer with a photoresist layer, patterning the photoresist layer via exposure, removing the photoresist over the TSV to expose the seed layer 5, producing the bump via electroplating, to form the electrical connection between the TSV conductive column 3 and the micro bump 6. The micro bump 6 may be made by metal materials including nickel and copper. In one embodiment, the micro hump 6 is produced by covering the copper with tin solder. First, the copper and tin solder layer with the necessary thickness is produced via electroplating technology, as an example, the thickness of the copper and tin solder layer may be 60/15 µm. Then the photoresist is removed after electroplating, and the desired bump forms via reflow, as the half spherical bump shown in FIG. 3. Finally, the seed layer outside the bump is removed via wet etching.

In the above embodiments, due to the sloping buffer 103, a transitional region with gradually varied height forms between the exposed TSV and the semiconductor substrate, which makes the seed layer continuously distributes in the region of exposed TSV, avoids the voids in the junction of the micro bump and TSV conductive column when the micro bump is produced, and hence guarantees the connection reliability.

In one embodiment of the present invention, a process that produces the TSV backside reveal in the first embodiment. This process may avoid the effect of TTV on the exposed TSVs, ensure that all exposed TSVs meet the height requirement, and reduce the damage to the exposed TSVs after the TSVs are exposed to improve the product quality. Meanwhile, by using the process of the embodiment, a transitional region with a certain curvature at the junction of the exposed TSV and the substrate forms alter the TSV is exposed. The transition region can ensure the continuous seed layer deposition when the seed layer used for electroplating is deposited on the TSV, which avoids the connection problem on the micro bump of TSV.

Figure 4:
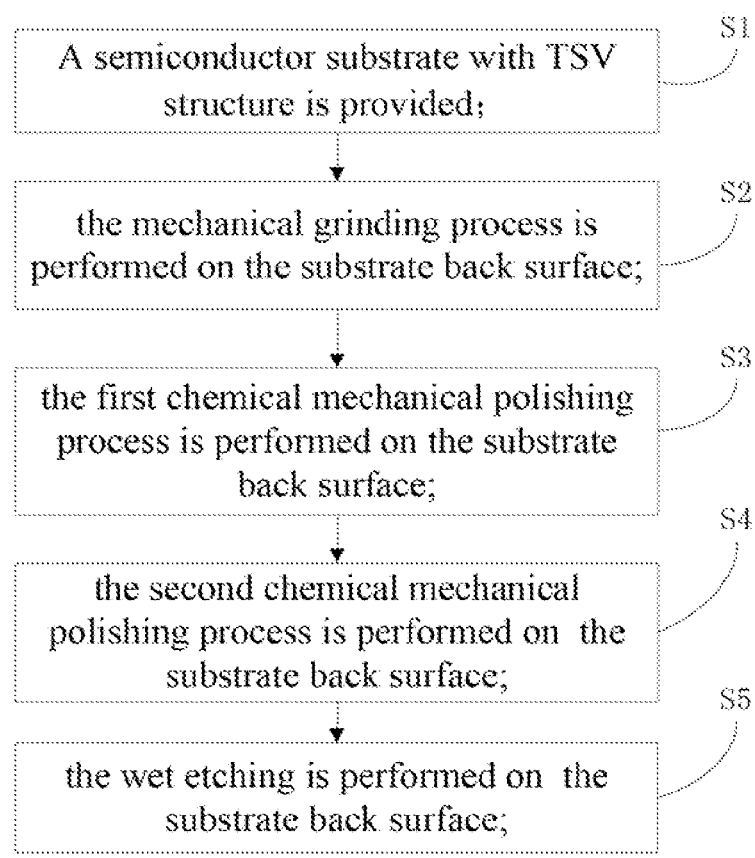
FIG. 4 illustrates the flow diagram of a TSV exposing process in an embodiment of the present invention.

FIG. 4 illustrates the brief flow diagram of a TSV exposing process provided in the present invention. As shown in FIG. 4, the process mainly includes following steps.

S11: a semiconductor substrate with TSV structure is provided. In one embodiment, a semiconductor substrate with a TSV conductive column, a liner between the substrate and the TSV conductive column, and a barrier between the liner and the TSV conductive column is provided.

S12: the mechanical grinding process is performed on the substrate back surface.

S13: the first chemical mechanical polishing process is performed on the substrate back surface after Step S12. In the first chemical mechanical polishing process, a non-selectivity polishing fluid is adapted to polish the substrate back surface to make the distance between the substrate back surface and the bottom of the TSV less than 1 μm, and make the TTV of the polished substrate back surface less than 1 μm.

S14: the second chemical mechanical polishing process is performed on the substrate back surface after Step S13. In the second chemical mechanical polishing process, a polishing fluid which has high selectivity ratio with regard to the substrate, the liner, and barrier is adapted.

S15: the wet of dry etching is performed on the substrate back surface after Step S14 to make the TSV backside reveal more than 10 μm.

A detailed description of the above process will be given in the so owing content with the specific implementation method.

FIGS. 5A to 5E illustrate the structure diagram of the backside reveal corresponding to each step in the above process.

Figure 5A:
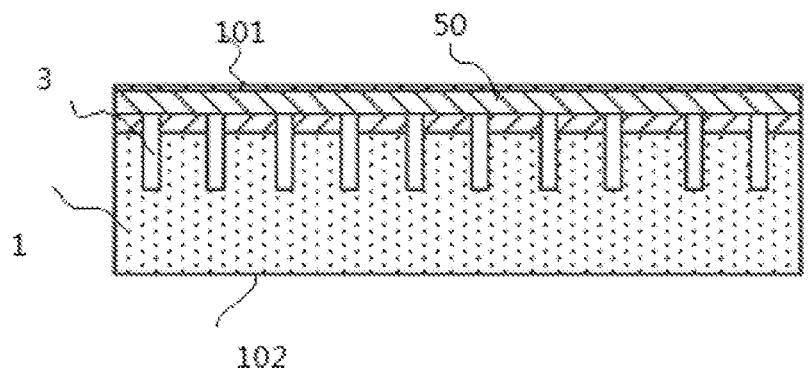
FIG. 5A to 5E illustrate the structure diagram of the backside reveal corresponding to each step in FIG. 4.

Firstly, a semiconductor substrate with TSV structure is performed, as shown in FIG. 5A. In an embodiment, the semiconductor substrate 1 is the semiconductor chip, which may be made by semiconductor materials including silicon, germanium, gallium nitride, and gallium arsenide. The chip includes some electronic components on the substrate front surface 101 and/or inside the substrate, or further includes (preferred but not required) a semiconductor interlayer structure 50, for example, a liner, conductive layer, conductive pattern region, and other connection and wiring structures designed for combining the above electronic components into a complete circuit. In one embodiment, the semiconductor chip may include multiple interaction layers composed by the above dielectric and the conductive layer. Typically, the number of interaction layers may be set within three to twelve, or two. In another embodiment, the semiconductor substrate 1 may be wafer, wherein its front surface 101 may be the die containing no semiconductor devices. Multiple TSVs 3 are produced in the semiconductor substrate 1.

Figure 5B:
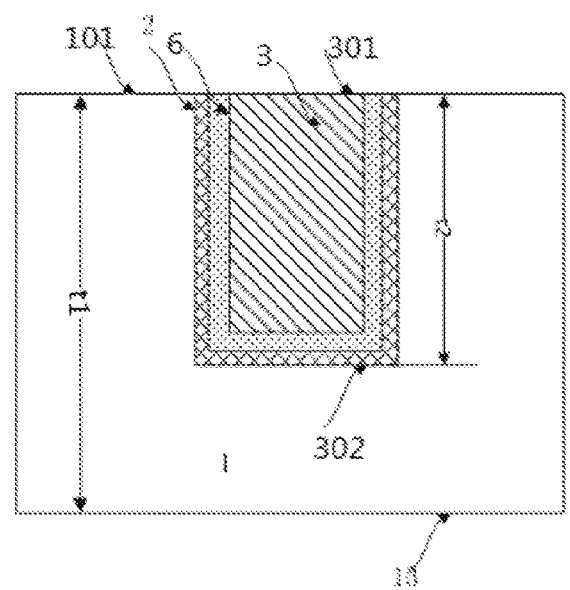

FIG. 5B shows the specific structure of the TSVs 3, including the liner 2 and barrier 6 on the wall of TSV, and the conductive column 3 covered with the liner 2 and barrier 6. The liner 2 may be silicon oxide, silicon nitride, silicon oxynitride, etc. The liner may be produced via directly performing oxidation or nitridation on the substrate, or via the coating, techniques including chemical vapor deposition (CVD), plasma enhanced chemical vapor deposition (PECVD), and low pressure chemical vapor deposition (LPCVD). The liner 2 is set between the TSV conductive column 3 and the semiconductor substrate 1 to serve as the insulation, which prevents the conductive material in TSV from affecting the carrier change in the semiconductor. The barrier 6 is adapted to prevent the conductive material from running through the liner 2, penetrating into the semiconductor substrate 1, and damaging the semiconductor substrate and electronic components on the semiconductor substrate when the TSV conductive column 3 is produced. The barrier 6 may be usually produced by single metal or combination of deposited multiple layers of metal successively. The single metal may be titanium, tantalum, titanium tungsten or ruthenium. The combination may be titanium nitride/titanium, tantalum nitride/ tantalum. The TSV conductive column 3 is produced by metal deposition. The TSV conductive column 3 is preferred to be metal material, such as Tungsten, copper, silver, nickel, etc. Other conductive materials, such as doped polycrystalline silicon and its composition, also may be used as the TSV conductive column 3. In the present invention, the TSV conductive column 3 is preferred to be made by copper. The front surface (top) 301 of TSV conductive column 3 is preferred to be connected with electronic components, the conductive layer, or the conductive pattern region on the substrate front surface 101. The back surface (bottom) 302 of TSV conductive column 3 goes deep into the semiconductor substrate 1, where the depth is usually within 50 μm-100 μm and the diameter is usually within 5 μm-50 μm, typically, the diameter is usually within 5 μm-10 μm. Since the existing wafer processing makes the thickness of the wafer reach 700 μm-775 μm, the thinning process should be performed on the substrate back surface 102 to ensure that the hack surface 302 of the TSV conductive column 3 exposes from the substrate back surface 102.

Figure 5C:
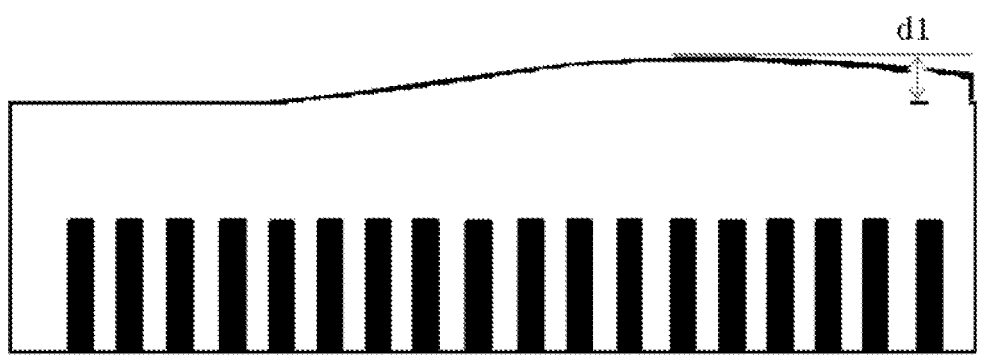

Firstly, the mechanical grinding is performed to thin the substrate back surface 102. Since the semiconductor substrate 1 is thick, the thickness should be reduced by more than 500 μm, so the thinning process should be realized by a high-efficiency thinning technique. Therefore, it is preferred to use the mechanical grinding technique to directly grind the substrate with grinding pad (e.g., grinding wheel). Since the mechanical grinding technique is relatively coarse, the TTV of the wafer after the mechanical grinding is high. As shown in FIG. 5C, the thickness difference d1 of the surface may reach 2 μm-3 μm or even larger.

Figure 5D:

After the mechanical grinding process, to make the TTV of the substrate surface acceptable, the first chemical mechanical polishing process is performed on the substrate back surface. In the first chemical mechanical polishing process, a non-selectivity polishing slurry is adapted to make the TTV of the substrate back surface less than 1 μm, achieve smooth substrate back surface, and further thin the thickness of the substrate, which makes the distance d2 between the substrate back surface and the back surface of the TSV less than 1 μm, as shown in FIG. 5D. This step can save the time required for the subsequent etching step. The polishing slurry is selected according to the material of the substrate. For example, when the substrate is made by silicon, the polishing slurry may be the ordinary silicon polishing, which contains abrasive, PH modifier, penetrant, lubricant, surfactant, chelating agent, deionized water, etc.

Figure 5E:
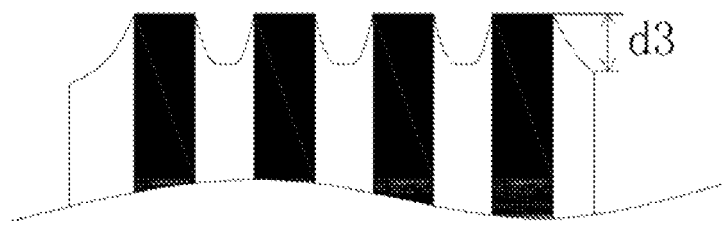

After the first chemical mechanical polishing, the back surface of the semiconductor substrate 1 is already very close to the back surface 302 of the TSV conductive column 3. Then a second chemical mechanical polishing is performed on the semiconductor substrate. In the second chemical mechanical polishing, a polishing slurry which has high selectivity ratio with regard to the semiconductor substrate 1, the liner 2, and the barrier 6, wherein the selectivity ratio of the semiconductor substrate 1 to the liner 2 is within 10:1 to 100:1, and the selectivity ratio of the liner 2 to the barrier 6 is preferred to be larger than 200:1. Therefore, in the second chemical mechanical polishing, the rate of polishing the substrate is the highest. The rate of polishing the barrier is the lowest, which effect is negligible. The polishing of the TSV can be stopped by the barrier 6, and the conductive copper column inside the barrier 6 will not be polished. When the polishing slurry erodes the substrate downward in the second chemical mechanical polishing process, since the pressures on the substrate in the vertical direction and pressure distribution are different due to polish selectivity, the polish rate in the different materials is different. Furthermore, since the rate of polishing the liner and the barrier is much less than the rate of polishing the substrate, the polish rate of the substrate in the region close to TSV is much smaller than that of other regions. Therefore, after the second chemical mechanical polishing process, the etched surface of the substrate is shown in FIG. 5E. The substrate region close to the TSV has the highest height, and the height of the substrate gradually decreases as the distance to the TSV increases, which forms a sloping transitional region. In the following wet or dry etching, since the etching is isotropic, the substrate is only etched in the vertical direction, and the sloping transition region is reserved. With this method, a buffer may be provided for the subsequent seed layer deposition, which makes the seed layer form a continuous depositional surface and improves the electrical connection between the TSV and the external.

The polishing depth of the second chemical mechanical polishing, i.e., the height d3 of the exposed TSVs should be controlled within 0.2 µm-0.5 µm, which depends on the spacing between TSVs. If the spacing between TSVs is small, the polishing depth should be shallow; otherwise, the polishing depth may be deep. In another word, the height of the exposed. TSVs depends on the spacing between TSVs. The smaller the spacing between TSVs is, the shorter of the exposed TSV will be.

In practice, the slurry used for the second chemical mechanical polishing can be modified from the commercial slurries to reach the required selectivity by adding inhibitor, etchant, or complexant etc. It can also be a dedicated slurry, which has very high Si to $SiO_2$ to barrier selectivity. The new slurry may contain TMAH, potassium hydroxide, or the mixture of hydrofluoric acid and nitric acid.

After the second chemical mechanical polishing, wet or dry etching process is performed on the substrate. The substrate is etched to a certain depth until all the TSV conductive columns are exposed with required height. The height of the exposed TSVs is usually larger than 10 µm.

In practice, the etching fluid used in the wet etching process may be TMAH, potassium hydroxide, or the mixture of hydrofluoric acid and nitric acid. In the etching fluid, the volume percent or the weight percent of each constituent may be controlled to change the selectivity ratio with regard to the substrate and the dielectric, layer. For example, as mentioned before, the volume percent ratio of hydrofluoric acid to nitric acid may be modified within 1:5 to 1:25, and the weight percent of TMAH etching fluid may be within 3 w %-30 w %. Those skilled in the art can understand that if there is not the barrier in the substrate, the selectivity ratio of the liner 2 to the barrier 6 will not be used in the second chemical mechanical polishing process.

In conclusion, the TSV exposing process provided in the present invention achieves following technical merits by performing two times of chemical mechanical polishing (CMP) after using mechanical grinding to thin the back surface of the wafer substrate.

The first CMP uses the non-selectivity polishing slurry to control the TTV of the polished substrate back surface less than 1 µm and combat the nonuniform problem of the backside reveals caused by the large TTV.

The second CMP uses the polishing slurry which has high selectivity ratio with regard to the substrate, the TSV liner, and the TSV barrier. The polishing is stopped by the TSV barrier, and the inside conductive column, such as conductive copper column, is protected from being polished. Moreover, the etched substrate has a transitional region for the seed layer deposition, which improves the robustness of the subsequent TSV electrical connection.

Those skilled in the art can understand that "TSV backside reveal", "backside reveal", "tip expose", "expose", "exposed TSV" may have the same meanings in the above embodiments.

The above description of the embodiments are used to make those skilled in the art understand or use the present invention. Obviously, those skilled in the art can understand that these embodiments can be modified. The principle of the present invention can be realized in other embodiments within the spirit and scope of the present invention. Therefore, the present invention is not limited by the embodiments in this literature. All the embodiments in accord with the principle and the novel feature of the present invention are considered to be within the protection scope of the present invention.

The invention claimed is:

1. A TSV exposing process, comprising:
performing a mechanical grinding process on the substrate back surface of a substrate with a TSV conductive column, a liner between the substrate and the TSV conductive column;
performing a first chemical mechanical polishing process on the grinded substrate back surface;
adapting a polishing slurry which has high selectivity ratio with regard to the substrate and the liner to perform a second chemical mechanical polishing process on the substrate back surface after the first chemical mechanical polishing process, and making the TSV outcrop;
performing an etching on the substrate back surface after the second chemical mechanical polishing process, and making the TSV backside reveal more than 10 µm.

2. The TSV exposing process of claim 1, wherein, a non-selectivity polishing slurry is adapted in the first chemical mechanical polishing process to make the distance between the substrate back surface and the bottom of the TSV conductive column less than 1 µm, and make the TTV of the polished substrate back surface less than 1 µm.

3. TSV exposing, process of claim 1, wherein, the TSV is exposed within 0.2 µm-0.5 µm after the second chemical mechanical polishing process.

4. The TSV exposing process of claim 1, wherein, the height of the TSV backside reveal depends on the spacing between TSVs; the smaller the spacing between TSVs is, the shorter of the TSV backside reveal will be.

5. The TSV exposing process of claim 1, wherein, the selectivity ratio of the substrate to the liner is within 10:1 to 100:1.

6. TSV exposing process of claim 1, wherein, the substrate is further with a barrier between the liner and the TSV conductive column; and a polishing slurry which has high selectivity ratio with regard to the liner and the barrier is further adapted in a second chemical mechanical polishing process.

7. The TSV exposing process of claim 6, wherein, the selectivity ratio of the liner to the harrier is larger than 200:1.

8. The TSV exposing process of claim 1, wherein, when the etching is wet etching, the etching fluid is TMAH, potassium hydroxide, or the mixture of hydrofluoric acid and nitric acid.

9. The TSV exposing process of claim 8, wherein, the volume percent ratio of hydrofluoric acid to nitric acid is within 1:5 to 1:25.

10. The TSV exposing process of claim 8, wherein, the weight percent of TMAH is within 3 w %-30 w %.

11. The TSV exposing process of claim 1, further comprising:
producing a dielectric layer via a coating technique on the substrate back surface;
removing the dielectric layer within the back surface of TSV conductive column via development or etching.

12. The TSV exposing process of claim 11, further comprising:
producing a seed layer on the hack surface of the TSV conductive column by metal deposition according to the arrangement of multiple layers of metals.

13. The TSV exposing process of claim 12, further comprising:
covering the seed layer with a photoresist layer,
patterning the photoresist layer via exposure, removing the photoresist over the TSV to expose the seed layer,
producing a bump via electroplating, to form the electrical connection between the TSV conductive column and the bump.

\* \* \* \* \*